United States Patent [19]
Gaines

[11] Patent Number: 6,062,797
[45] Date of Patent: *May 16, 2000

[54] TOP PLATFORM AND INTERCHANGEABLE GUIDE LANE ASSEMBLAGE FOR VIBRATORY FEEDERS

[75] Inventor: Jefferson J. Gaines, Tucson, Ariz.

[73] Assignee: US Vibra Inc., Tucson, Ariz.

[*] Notice: Under 35 U.S.C. 154(b), the term of this patent shall be extended for 492 days.

[21] Appl. No.: 08/777,413

[22] Filed: Dec. 30, 1996

Related U.S. Application Data

[63] Continuation of application No. 08/321,243, Oct. 11, 1994, abandoned.

[51] Int. Cl.⁷ .................................................. B65G 27/08

[52] U.S. Cl. ...................... 414/415; 414/416; 198/763; 221/189

[58] Field of Search .................................. 414/224, 415, 414/416, 417; 198/763; 221/189

[56] References Cited

U.S. PATENT DOCUMENTS

| | | | |
|---|---|---|---|
| 4,952,109 | 8/1990 | Hendricks | 414/224 |
| 5,116,185 | 5/1992 | Lofstedt | 414/415 |
| 5,154,316 | 10/1992 | Holcomb et al. | 414/415 |
| 5,184,716 | 2/1993 | Gaines | 198/763 |
| 5,328,317 | 7/1994 | Masui et al. | 414/415 |
| 5,361,937 | 11/1994 | Wiese | 221/189 |

*Primary Examiner*—Thomas J. Brahan
*Attorney, Agent, or Firm*—Richard R. Mybeck; Peter B. Scull

[57] ABSTRACT

A top platform with interchangeable guide lanes for use on vibratory feed devices is described. The top platform comprises a rectangular deck member on which is attached a brace means including at least one elevator brace, and at least one holddown brace for holding one or more conventional anti-static delivery tubes in a ski-slope configuration. The top deck also comprises a plurality of mounting holes arranged in an orderly rank and file configuration to secure and facilitate adjustment of the guide lanes.

15 Claims, 1 Drawing Sheet

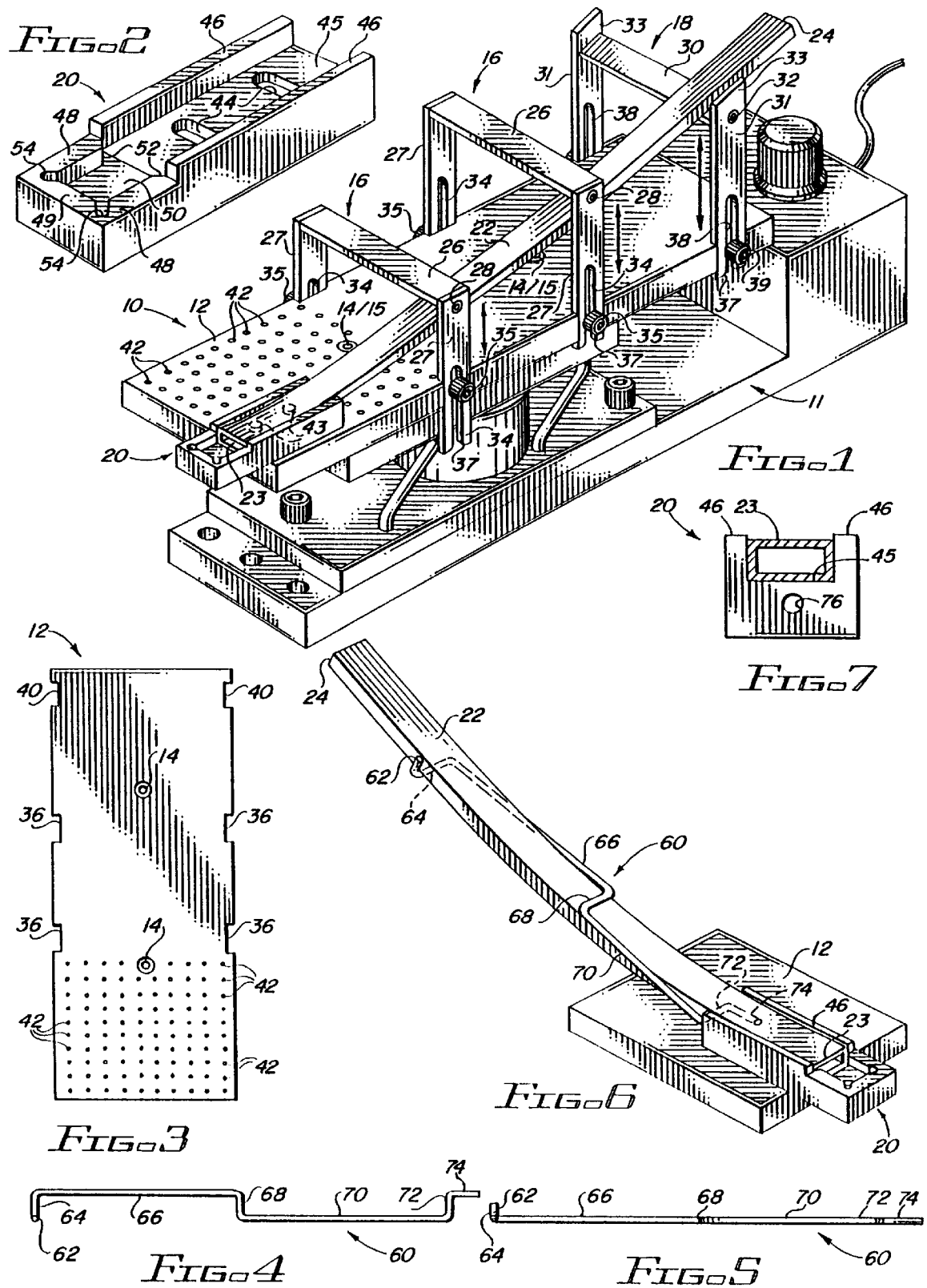

TOP PLATFORM AND INTERCHANGEABLE GUIDE LANE ASSEMBLAGE FOR VIBRATORY FEEDERS

This application is a continuation of U.S. patent application Ser. No. 08/321,243 filed Oct. 11, 1994 for TOP PLATFORM AND INTERCHANGEABLE GUIDE LANE ASSEMBLAGE FOR VIBRATORY FEEDERS, now abandoned.

INTRODUCTION

The present invention relates generally to an improved delivery assistance device which more specifically involves a top platform with interchangeable guide lanes for a vibratory feeder used in surface mount electronic assembly applications.

BACKGROUND OF THE INVENTION

The continued miniaturization in the electronic field gives rise to a need for self contained assembly and feeder units which are ready to mount into an existing work envelope for use with pick and place machinery and robotic work stations whenever and wherever reliable parts delivery is required. In particular, electronic component feeders which are intended for use in automatic pick and place or robotic assembly of integrated circuit boards and like electronic applications, must provide steady and dependable delivery of parts to a given work site. Furthermore, it is extremely important that the part be correctly oriented and strategically aligned so that they can properly interface with other systems including the pick and place machinery and like robotics to ensure that each part is where it should be when it should be and arrives oriented as it should be so that preset scheduling of an efficient production line can be maintained. It is for this reason that existing vibratory feeders were designed.

However, some of the major problems with existing vibratory feeders, are the frequent misorientation or misalignment of critical parts and the frequent and expensive downtime required to change dedicated vibratory feeder platforms when switching from the delivery of one type of circuit board component to a different type of component for continued assembly of the same or a different circuit board. The different or substitute components are usually of different sizes and shapes and the prior art dedicated platforms are generally made to accommodate only a limited quantity of sizes and shapes of component parts. Thus, the time lost to production includes both the manual switching of dedicated platforms as well as the programming adjustment of the X and Y coordinates of the automated pick and place or robotic machinery to properly locate and pick up the newly selected different component.

Accordingly, a serious need exists in industrial assembly lines and particularly those with integrated surface mounted electronic assembly applications for a new and improved parts delivery device which saves time and money while increasing productivity and enhances the reliability and dependability of such machines and enables them to contribute more to the overall efficiency of the assembly production line.

It has been found and will hereinafter appear in greater detail that the device of the present invention is directed not only solves the prior art problems but provides a reliability and precision heretofore unobtainable by similar prior art devices.

BRIEF SUMMARY OF THE INVENTION

The present invention is based upon a unique interchangeable top platform and interchangeable guide lanes for vibratory feeders which provides for fast, efficient exchange of guide lanes without disturbing the pick point X and Y coordinates of the component parts presented by the feeder for automatic pick up by pick and place or robotic machinery. More particularly, the present invention provides an in-line, customizable vibratory feeder platform with interchangeable guide lanes for delivering small diverse component parts and which is also adapted to coact with a plurality of anti-static delivery tubes in automated surface mount electronic assembly applications.

The structure of the present invention comprises a substantially flat rectangular deck member that is detachably mountable on an existing vibratory feeder such as that described in U.S. Pat. No. 5,184,716 to Gaines. Attached to the deck member are at least one each of two types of anti-static tube braces; namely, a holddown brace and an elevator brace. These braces are used to configure and hold in a ski-slope shape the various anti-static delivery tubes used to feed component parts to the vibratory feeder. The mouths of these delivery tubes are inserted in interchangeable guide lanes which in turn are detachably attached to the deck member. The present invention uses a plurality of interchangeable guide lanes made in diverse sizes and shapes to correspondingly accommodate the diverse sizes and shapes of a plurality of delivery tubes and component parts. A rectangular array of mounting holes is formed in the deck member to provide maximum interchangeability and adjustability of the plurality of interchangeable guide lanes to deliver a larger variation of component parts. This also provides a dramatically increased usability with a greater quantity of pick and place machinery having a wide range of pick point tolerances and thus provides uniform delivery without requiring continued readjustment of the automated pick and place or robotic machinery.

Accordingly, a principal object of the present invention is to provide a new and improved interchangeable vibratory feeder top platform with interchangeable guide lanes having improved adjustability in the delivery and orientation of a plurality of small component parts.

Another object of the present invention is to provide a new and improved means for interchangeably and adjustably adapting a top platform with interchangeable guide lanes to simultaneously deliver one or more of a plurality of diversely sized and shaped component parts transported in a plurality of diversely sized and shaped anti-static feed tubes in automated surface mount electronic assemblies.

These and still further objects as shall hereinafter appear are readily fulfilled by the present invention in a remarkably unexpected manner as will be readily discerned from the following detailed description of an exemplary embodiment thereof especially when read in conjunction with the accompanying drawings in which like parts bear like numerals throughout the several views.

BRIEF DESCRIPTION OF THE DRAWINGS

In the drawings:

FIG. 1 is an isometric view of a top platform assemblage operatively attached to a vibratory feeder in accordance with the present invention;

FIG. 2 is an isometric view of a guide lane embodying the present invention;

FIG. 3 is a plan view of a deck member embodying the present invention;

FIG. 4 is a plan view of a brace member useful in an alternate embodiment of the present invention;

FIG. 5 is a side elevational view of the brace member of FIG. 4;

FIG. 6 is an isometric view of another top platform and guide lane assemblage embodying the present invention; and FIG. 7 is an end view of an alternative guide lane for use with the embodiment of FIG. 6.

DESCRIPTION OF PREFERRED EMBODIMENT

The present invention relates generally to vibratory feeder devices and more particularly to a unique top platform and guide lane assemblage for use with existing vibratory feeders. The preferred embodiment of the assemblage is shown in FIG. 1 and is identified by the general reference numeral 10. A conventional vibratory feeder 11 is also shown in FIG. 1 with assemblage 10 operatively attached thereto. A more thorough description of such vibratory feeders can be found in my prior U.S. Pat. No. 5,184,716 to Gaines which is incorporated herein by this reference thereto. In general, vibratory feeders 11 are used to present small component parts to automated pick and place or robotic machinery in electronics assembly operations.

Assemblage 10 has a rectangular deck member 12 to which all the other constituent parts of the present invention are detachably secured. A plan view of deck member 12 is shown in FIG. 3 a view in which no constituent parts are shown attached. Two large mounting holes 14 in deck member 12 are shown in FIGS. 1 and 3. Holes 14 are formed to correspond in size and location to the mounting holes (not shown) in vibratory feeder 11. Screws 15, as shown in FIG. 1, attach assemblage 10 to vibratory feeder 11 via mounting holes 14.

Also shown in FIG. 1 attached to deck member 12, are other constituent parts of the present invention including two holddown braces 16, one elevator brace 18, one guide lane 20, and an anti-static delivery tube 22. In a preferred practice of the present invention braces 16 and 18 constitute anti-static tube brace means used to hold one or more anti-static tubes 22 in operative relationship to an associated guide lane 20. As described below, the preferable shapes imparted on tubes 22 are general ski-slope shapes which optimize the gravitationally forced movement of component parts therethrough.

Braces 16, 18, and one or more guide lanes 20 are rigidly yet detachably and adjustably secured to deck member 12 as will be described in more detail below. Delivery tube 22 is of a type already generally known to those skilled in the art, and comprises flexible, hollow tube having a substantially rectangular cross-section. Tube 22 is inserted into assemblage 10 and is configured into a ski-slope shape by placing mouth 23 is positioned in guide lane 20 and adjusting holddown braces 16 to bear down upon the lower portion of tube 22 while elevator brace 18, is adjusted to force rearward supply end 24 upwardly. In this way, tube 22 is provided virtually no slope gradient adjacent mouth 23, has a gentle slope in the area of holddown braces 16 and a steeper more upward slope adjacent elevator brace 18 toward rearward supply end 24.

Each holddown brace 16 comprises a cross member 26 supported by two adjustable legs 27. Cross member 26 is attached to legs 27 at respective attachment points 28 using screws or other adhesive or cohesive means. Elevator brace 18 comprises similar members including a cross member 30 attached to legs 31 at points 32. However, as shown in FIG. 1, the cross member 30 of elevator brace 18 is angled slightly relative to the horizontal elevator brace 18 to conform to the imparted slope to delivery tube 22. Further, elevator brace 18 is formed so that each leg 31 has a portion 33 which extends above cross member 30 to limit the lateral movement of delivery tube 22 and prevent tube 22 from moving laterally off of cross member 30.

As further shown in FIG. 1, cross members 26 and 30 are generally flat rectangular members which are rigidly attached to legs 27 and 31. Alternatively, cross members 26 and 30 can be cylindrical. These cylindrical members may also be attached rigidly, or they may be pivotally attached in roller fashion to facilitate the insertion and removal of various delivery tubes 22 into the assemblage.

Each leg 27, 31 of braces 16, 18, respectively, has a longitudinally extending slot 34 and 38 disposed on the longitudinal axis of each leg and extending at least half of the length of such leg 27, 31 from lower ends 37 axially upward toward the connection points 28, 32. Turn screws 35 and 39, are respectively, are inserted in and through slots 34, 38 to attach braces 16, 18 to deck member 12. Slots 34, 38 facilitate the vertical adjustability of braces 16, 18 when screws 35, 39 are loosened by allowing the raising and lowering of braces 16, 18 and define the slope gradient desired for delivery tube 22. As an alternative, legs 27 and 31 may have single or multiple holes (not shown) in lieu of slots 34, 38 to provide fixed or multiple fixed attachment positions for braces 16 and 18.

FIG. 2 shows the details of deck member 12 which are partially obscured in FIG. 1 including squared notches 36 and 40 which are formed in deck member 12 to receive legs 27, 31 of braces 16, 18, respectively. Notches 36, 40 provide legs 27, 31 with stability and prevent any undesirable rotation of braces 16 and 18. Also shown in FIG. 2 are a plurality of small mounting holes 42 in a uniformly spaced rectangular array. There are preferably eight or nine rows of approximately fifteen mounting holes 42 each which are used to attach various shaped guide lanes 20 to deck member 12. Note, the drawings show an acceptable ten by ten grid of holes 42. As shown by the dotted lines in FIG. 1, suitable screws or pegs 43 are placed into mounting holes 44 in guide lane 20 as shown in FIG. 2 and are secured in a corresponding mounting hole 42.

FIG. 2 shows a typical guide lane 20 in more detail. In particular, guide lane 20 has a flat bottom portion 45 (in which mounting holes 44 are formed) and two side walls 46 leading to a thicker pair of side walls 48 which are each connected to thick front wall 49 interposed orthogonally therebetween. Thicker, shorter side and front walls 48 and 49 define the component pick point or receiving area 50 in which the plurality of components emerging from mouth 23 of delivery tube 22 are received. The other demarcations of receiving area 50 include the diagonal transitions 52 between thin side wall 46 and thick side wall 48 and circular notches 54 disposed at the intersection of thicker side wall 48 with front wall 49. Transitions 52 and notches 54 are particularly important in the preferred embodiment because they enable certain pick and place automated or robotic machinery (not shown) to better grip the component parts which come to rest in receiving area 50.

Another embodiment of the present invention is shown in FIGS. 4, 5, 6 and 7 and demonstrates an alternative embodiment of anti-static tube brace means. In particular, this embodiment employs an inverted "S"-shaped brace 60 coactive with a deliver tube 22 to create and maintain a warped or curvilinear configuration for ski-slope descent. It is noted that while an inverted S-shape is shown for brace 60, a standard "S" or like shapes capable of biasing delivery tube 22 into a curvilinear slope can also be used. Brace 60 comprises an upturned portion 62 at one end which extends from the upper support cross portion 64. First elongated portion 66 extends between and connects upper support cross portion 64 to crossover fulcrum portion 68 at or near the center of brace 60. The lower end of brace 60 comprises a second elongated portion 70 which is connected to and extends between fulcrum portion 68 and lower support cross portion 72 which has a prong member 74 extending therefrom and which when installed in a manner to be described, supports delivery tube 22 at a preselected angle as slope relative to deck member 12. When attached to delivery tube member 22, brace 60 holds tube 22 in operative relationship to assemblage 10. As described above, mouth 23, which is disposed at the lower end of delivery tube 22 is inserted in guide lane 20 between side walls 46 as shown in FIG. 6. Curvilinear brace 60 is engaged upon tube 22 so that cross portion 72 is disposed beneath tube 22 adjacent its point of entry into guide lane 20 while prong 74, which is integrally formed with and extends from cross portion 72 at a pre-bent included angle complementary to the slope of tube member 22. Prong 74 is then inserted into a mounting hole 76 defined in guide lane 20 as shown in FIG. 7. In practice, when the desired slope for tube 22 is 45°, for example, the included angle will be 135° (180°–45°). In practice, crossover fulcrum 68 holds downward by pressing upon the top of tube 22 while upper support portion 64 brace 60 is disposed beneath and bears upwardly on the upper portion of tube 22. The effect of the coaction between brace 60 and tube 22 is to impart a downwardly or ski-slope configuration to tube 22 when operatively interfaced with guide means 20 and deck member 12.

In general, the basic constituent parts of the preferred embodiment of the present invention are made from aluminum or other sturdy, inexpensive and simply useable and formable materials. Further, any of a number of well known manufacturing techniques may be employed in constructing the components of the present invention.

In one practice of the present invention as shown in FIG. 1, an aluminum deck member 12 is first constructed having preferred dimensions of about 7.5 inches in length by about 3.4 inches in width and being about 0.25 inches thick. The large mounting holes 14 are preferably located along the central longitudinal axis of deck member 12 and, to adapt to the preferred vibratory feeder described above, are set three inches apart. The rectangular array of mounting holes 42 are drilled in one end of deck member 12 such that the preferable eight or nine rows are typically about 0.375 inches apart and the preferable fifteen holes in each row are typically about 0.197 inches apart. The squared notches 36 and 40 are cut from the sides of the other end of deck member 12, from which end notches 40 preferably begin at about 0.125 inches, and notches 36 preferably begin at about 1.950 and 3.303 inches on both longitudinal sides of deck member 12. Notches 36 and 40 are cut to receive leg members and preferably will be about 0.5 inches in length and about 0.09 inches deep.

The preferable heights of holddown braces 16 are about 1.5 inches with slots 34 running approximately an inch starting at open lower ends 37 of legs 27. Elevator braces 18 may extend greater than two inches in height with slots 38 of greater than one inch. Cross members 26 and 30 will correspond to the gap defined between legs 27 and legs 31 and in the illustrated embodiment will be approximately 3.2 inches in length.

Guide lanes 20 are made in a plurality of sizes and shapes to accommodate the various component parts and delivery tubes 22 to be used with this invention. The only critical dimension for matching the various guide lanes 20 with deck member 12 as described above is that the distance between the centers of mounting holes 44 must align with any two of mounting holes 42 defined in deck member 12. In practice, a distance of 0.75 inches between the centers of holes 44 is effective.

Lastly, "S"-shaped brace 60 may be made from any number of materials and in various shapes and sizes. The minimum requirement is that it be stiff enough to hold a tube 22 in the ski-slope shape as shown in FIG. 6.

To use the present invention, the anti-static delivery tube brace means, which in the preferred embodiment includes front holddown braces 16 and elevator braces 18, is first mounted to deck member 12 to support one or more anti-static tubes 22 in an appropriate ski-slope shape. Then, one or more required guide lanes 20, corresponding in number to the number of tubes 22 are secured to appropriate mounting holes 42 in deck member 12. Thereafter, an anti-static delivery tube 22 is mounted over elevator brace 18, and beneath braces 16 so that mouth 23 is positioned in the appropriately sized guide lane 20. When thus positioned, the desired slope is imparted to tube 22 by adjusting the height of braces 16, 18 so that brace 18 raises the associated portion of tube 22 to the desired height and brace 16 bears down on tube 22 sufficiently to maintain the desired slope for tube member 22. A plurality of tubes 22 may be inserted, each with an associated guide lane 20 to enable several tubes 22 to simultaneously be disposed in generally parallel relationship to each other on deck member 12. Component parts to be delivered through delivery tubes 22, are sequentially placed in a supply end 24 of an appropriate delivery tube 22. Then, the vibrating motion of assemblage 10 moves said small component parts down the lengths of the tube 22 in which they are loaded into the corresponding receiving areas or pick points 50 where the automated or robotic pick and place machinery (not shown) retrieves them.

In practice, a substitute or different type of component part may be switched onto an assemblage 10 by merely removing a single guide lane 20 and corresponding tube 22, and inserting therein the desired substitute or different guide lane 20 which is correspondingly sized and shaped to accommodate the new and different type of component parts with its associated tube 22. In this way, an entire platform assemblage 10 need not be removed and replaced, and further, the X and Y coordinates of the automated or robotic machinery need not be reprogrammed or readjusted. This results in a considerable savings in time and effort which translates into desirable improvement in efficiency and cost.

From the foregoing, it is readily apparent that a new and useful embodiment of the present invention has been herein described and illustrated which fulfills all of the aforestated objects in a remarkably unexpected fashion. It is of course understood that such modifications, alterations, and adaptations as may readily occur to the artisan confronted with this disclosure are intended within the spirit of this disclosure which is limited only by the scope of the claims appended hereto.

Accordingly, what is claimed is:

1. An interchangeable top platform assemblage for operative installation upon a vibratory feed device for coaction with one or more diversely sized and shaped feed tubes to deliver one or more deversely sized and shaped acts of component parts to one or more pick-up points, said assemblage comprising a rectangle deck member operatively attachable to a vibratory feed device; tube brace means attached to said deck member, said tube brace means being coactive with each said tube to hold each said tube in a sloping position; and one or more guide lanes, each said guide lane being detachably attachable to said deck member relative to a corresponding one of said one or more feed rubes to receive component parts therefrom and define a pick-up point therefor; said deck member having a plurality of mounting holes defined therein for detachably attaching each said guide lane thereto; said plurality of mounting holes being formed in an orderly rank and file configuration on said deck member.

2. A top platform assemblage according to claim 1 in which each said guide lane is dimensioned to receive a corresponding one of said one or more diversely sized and shaped sets of component parts from its corresponding feed tube.

3. An interchangeable top platform assemblage according to claim 2 whereby said tube brace means imparts to said sloping position of said feed tube, a gentle slope near the lower end of said feed tube and a steeper slope near the upper end of said feed tube.

4. An interchangeable top platform assemblage according to claim 1 whereby said tube brace means imparts to said sloping position of said feed tube, a gentle slope near the lower end of said feed tube and a steeper slope near the upper end of said feed tube.

5. A top platform assemblage for operative installation upon a vibratory feed device for delivering component parts to corresponding pick-up points, said assemblage comprising a rectangular deck member, brace means, and delivery means coactive with said deck member and said brace means deliver one or more diversely shaped sets of component parts to corresponding pick-up points; said deck member having a plurality of mounting holes defined therein for detachably attaching said delivery means thereto; said plurality of mounting holes being formed in an orderly rank and file configuration.

6. A top platform assemblage according to claim 5 in which said delivery means comprises one or more combinations of feed tubes and complementary guide lanes; each said feed tube being operatively disposed by said brace means in operable position in communication with each said complementary guide lane, each said guide lane being detachably secured to said deck member in operable position so that it defines a corresponding pick-up point for said component parts emerging from said feed tubes.

7. A top platform assemblage according to claim 6 in which each guide lane is dimensioned to receive a corresponding one of said diversely shaped sets of component parts from the corresponding one of said feed tubes.

8. A top platform assemblage according to claim 5 in which said brace means imparts a sloping position to said delivery means whereby said delivery means has a gentle slope near the lower end thereof and a steeper slope near the upper end thereof.

9. A component parts feed device for delivering component parts to corresponding pick-up points; said feed device comprising a base, moving means attached to said base for moving said component parts toward said pick-up points, and a top platform assemblage operatively connected to said moving means; said assemblage comprising a rectangular deck member, brace means, and delivery means coactive with said deck member and said brace means to deliver one or more deversely shaped sets of component parts to corresponding pick-up points; said deck member having a plurality of mounting holes defined therein for detachably attaching said delivery means thereto; said plurality of mounting holes being formed in an orderly rank and file configuration.

10. A feed device according to claim 9 in which said delivery means comprises one or more combination of feed tubes and complementary guide lanes; each said feed tube being operatively disposed by said brace means in operable position in communication with each said complementary guide lane; each said guide lane being detachably attachable to said deck member in operable position so that it defines a corresponding pick-up point for said component parts emerging from said feed tubes.

11. A feed device according to claim 9 in which each said guide lane is dimensioned to receive a preselected one of said diversely shaped sets of component parts from the corresponding one of said feed tubes.

12. A feed device according to claim 9 in which said moving means for moving said component parts is gravitational.

13. A top platform assemblage according to claim 12 in which said brace means imparts a sloping position to said delivery means said delivery means has a gentle slope near the lower end thereof and a steeper slope near the upper end thereof.

14. A feed device according to claim 9 in which said moving means for moving said component parts is vibratory.

15. A top platform assemblage according to claim 9 in which said brace means imparts a sloping position to said delivery means has a gentle slope near the lower end thereof and a steeper slope near the upper end thereof.

* * * * *